United States Patent
Nguyen

(10) Patent No.: US 6,495,449 B1
(45) Date of Patent: Dec. 17, 2002

(54) MULTILAYERED DIFFUSION BARRIER STRUCTURE FOR IMPROVING ADHESION PROPERTY

(75) Inventor: Tue Nguyen, Fremont, CA (US)

(73) Assignee: Simplus Systems Corporation, Fremont, CA (US)

( * ) Notice: Subject to any disclaimer, the term of this patent is extended or adjusted under 35 U.S.C. 154(b) by 0 days.

(21) Appl. No.: 09/520,107

(22) Filed: Mar. 7, 2000

(51) Int. Cl.⁷ .......................................... H01L 21/4763
(52) U.S. Cl. ...................... 438/627; 438/644; 438/654; 438/769
(58) Field of Search .................. 438/627, 642, 438/643, 644, 654, 648, 649, 682, 683, 685, 769, 770, 775

(56) References Cited

U.S. PATENT DOCUMENTS

| | | | |
|---|---|---|---|
| 5,654,245 A | * 8/1997 | Allen | 438/629 |
| 5,780,346 A | * 7/1998 | Arghavani et al. | 438/437 |
| 5,909,637 A | 6/1999 | Charneski et al. | |
| 5,913,144 A | 6/1999 | Nguyen et al. | |
| 6,261,925 B1 | * 7/2001 | Arghavani et al. | 438/424 |

* cited by examiner

*Primary Examiner*—Kevin M. Picardat

(57) ABSTRACT

A method has been provided for improving the adhesion of copper to a nitrided metal diffusion barrier material, such as TiN, in an integrated circuit substrate. The method provided a multilayered diffusion barrier structure, comprising a nitrided metal diffusion barrier layer and an oxy-nitrided metal layer. The formation of an oxy-nitrided metal layer, instead of an oxide layer, permits the optimization of both contact resistance and adhesion property. The oxy-nitrided metal layer is formed either by the partial incorporation of oxygen into the nitrided metal diffusion barrier or by deposition in an oxygen ambient.

24 Claims, 1 Drawing Sheet

MULTILAYERED DIFFUSION BARRIER STRUCTURE FOR IMPROVING ADHESION PROPERTY

FIELD OF THE INVENTION

This invention relates generally to integrated circuit processes and fabrication, and more particularly, to a method of improving the adhesion property of a diffusion barrier structure.

BACKGROUND OF THE INVENTION

The demand for progressively smaller, less expensive, and more powerful electronic products creates the need for smaller geometry integrated circuits (ICs), and large substrates. It also creates a demand for a denser packaging of circuits onto IC substrates. The desire for smaller geometry IC circuits requires that the dimension of interconnections between the components and the dielectric layers be as small as possible. Therefore, recent research continues to focus on reduction of the cross section area of via interconnects and connecting lines. The conductivity of the interconnects is reduced as the surface area of the interconnect is reduced, and the resulting increase in interconnect resistivity has become an obstacle in IC design. Conductors having high resistivity create conduction paths with high impedance and large propagation delays. These problems result in unreliable signal timing, unreliable voltage levels, and lengthy signal delays between components in the IC. Propagation discontinuities also result from intersecting conduction surfaces that are poorly connected, or from the joining of conductors having highly different resistivity characteristics.

There is a need for interconnects and vias to have low resistivity, and the ability to withstand volatile process environments. Aluminum and tungsten metals are often used in the production of integrated circuits for making interconnections or vias between electrically active areas. These metals have been used for a long time in the production environment because the processing technologies for these metals were available. Experience and expertise on these metals have also been acquired in the process due to the long term usage.

Copper is a natural choice to replace aluminum in the effort to reduce the size of lines and vias in an electrical circuit. The conductivity of copper is approximately twice that of aluminum and over three times that of tungsten. As a result, the same current can be carried through a copper line having half the width of an aluminum line.

The electromigration characteristics of copper are also much superior to those of aluminum. Copper is approximately ten times better than aluminum with respect to electromigration. As a result, a copper line, even one having a much smaller cross-section than an aluminum line, is better able to maintain electrical integrity.

However, there have been problems associated with the use of copper in IC processing. Copper poisons the active area of silicon devices, creating unpredictable responses. Copper also diffuses easily through many materials used in IC processes and, therefore, care must be taken to keep copper from migrating.

Various means have been suggested to deal with the problem of copper diffusion into integrated circuit materials. Several materials, including metals and metal alloys, have been suggested for use as barriers to prevent the copper diffusion process. The typical conductive diffusion barrier materials are TiN, TaN and WN. Addition of silicon into these materials, TiSiN, TaSiN, WSiN, could offer improvement in the diffusion barrier property. For non-conductive diffusion barrier, silicon nitride has been the best material so far. However, the adhesion of copper to these diffusion barrier materials has been, and continues to be, an IC process problem.

The conventional process of sputtering, used in the deposition of aluminum, will not work well when the geometry of the selected IC features are small. It is impractical to sputter metals, either aluminum or copper, to fill small diameter vias, since the gap filling capability is poor. Therefore new deposition processes have been used with diffusion barrier and copper in the lines and interconnects of an integrated circuit. To improve the gap fill capability, one of the techniques to deposit copper is the chemical vapor deposition (CVD) technique.

In a typical copper CVD process, copper is combined with a ligand, or organic compound, to make the copper volatile. That is, copper becomes an element in a compound, called precursor, that is vaporized into a gas. Selected surfaces of an integrated circuit, such as that of diffusion barrier materials, are exposed to the copper gas in an elevated temperature environment. When the copper gas compound decomposes, copper is left behind on the selected surfaces. Several copper precursors are available for use with the CVD process. It is generally accepted that the configuration of the copper precursors, at least partially, affects the ability of the copper residue to adhere itself to the selected surfaces. Although certain precursors may improve the copper adhesion process, variations in the diffusion barrier surfaces to which the copper is applied, and variations in the copper precursors themselves, often result in unsatisfactory adhesion of copper to a selected surface.

Similarly, diffusion barrier materials could be deposited by the chemical vapor deposition technique. For example, in the case of TiN CVD deposition, a precursor that contains Ti and optionally nitrogen, is used. The precursor decomposes at the selected surfaces, and the decomposed elements react together to form a TiN layer on these selected surfaces. Precursor by-products (products formed as the precursor decomposes that do not participate in the reactions) and reaction by-products (products formed from the reaction that do not deposited on the selected surfaces) are often volatile and being exhausted away.

It has become a standard practice in the semiconductor industry to apply CVD copper immediately after the deposition of the diffusion barrier material to the integrated circuit to improve the adhesion and to reduce the contact resistance. Typically, the processes are performed in a single chamber or an interconnected cluster chamber. It has generally been thought that the copper layer has the best chance of adhering to the diffusion barrier material when the diffusion barrier material surface is clean and free of contaminants. Hence, the diffusion barrier surface is often kept under vacuum, or in a controlled environment, and the copper is deposited on the diffusion barrier as quickly as possible. However, even when copper is immediately applied to the diffusion barrier surface, problems remain in keeping the copper properly adhered.

Charneski et al., U.S. Pat. No. 5,909,637, entitled "Copper adhesion to a diffusion barrier surface and method for same", proposed a method to use reactive gas species to clean the surface of the diffusion barrier to improve the adhesion to the subsequently deposited copper layer. This method has very limited success and often does not provide enough adhesion to be practical. Nguyen et al., U.S. Pat. No. 5,913,144, entitled "Oxidized diffusion barrier surface for the adherence of copper and method for same", further proposed a method to use reactive oxygen species to oxidize the diffusion barrier surface to improve the adhesion to the subsequently deposited copper layer. This method works well to improve the adhesion property, but by oxidizing the barrier material, it produces a non conductive layer that significantly increases the contact resistance of the integrated circuit even at a very small thickness.

It would be advantageous to understand the mechanism of the adhesion of CVD copper to a diffusion barrier material surface.

It would be advantageous to employ a method of improving the adhesion of CVD copper to a diffusion barrier material surface without oxidizing the diffusion barrier, without producing a non conductive layer and without increasing the contact resistance.

It would be advantageous to employ a method of improving the adhesion of CVD copper to a diffusion barrier material surface that can be optimized with respect to the contact resistance.

Accordingly, a method of improving the adhesion to the diffusion barrier surface is provided based on the analysis and understanding of the properties of the diffusion barriers. A good diffusion barrier, by definition, does not allow foreign materials to diffuse through. It also has poor chemical bonding with many foreign materials. It is not thermodynamically favorable for the diffusion barriers to bond with other materials because the resultant heat of formation is positive, that is, additional energies are required for these reactions. Therefore the adhesion property of good diffusion barrier materials based on chemical reaction is very poor. Deposition techniques that depend on chemical reactions to provide strong adhesion, such as chemical vapor deposition or electrochemical plating techniques, will be much more difficult to achieve good adhesion. In addition, copper material does not adhere well to many other materials, and thus adhesion of CVD copper to the diffusion barrier is even more difficult.

From thermodynamic arguments, good diffusion barriers for copper thus are those that have a positive heat of formation with copper. The nitrided metal diffusion barriers such as TiN, TaN, WN, TiSiN, TaSiN, WSiN, composed of mainly nitrogen and other metallic components such as Ti, Ta, W, offer the best conductive diffusion barrier property against copper diffusion. Copper nitrides have positive heats of formation so that it is thermodynamically unfavorable for copper to bond to nitrogen. These nitrides are more thermodynamically stable than copper nitrides and thus are effective against copper bonding and diffusion. Of all the mentioned nitrides, TiN and WN are similar to each other. TaN is a somewhat better barrier than either TiN or WN, and thus adhesion of CVD copper to TaN is much more difficult to achieve than to TiN or WN. The adhesion property of copper to an effective diffusion barrier however is poor.

To improve the adhesion of the nitrided metal diffusion barrier to copper, it is imperative to change the surface properties of the nitrided metal diffusion barrier layer. This surface should contain materials that bond with copper. Thermodynamically, it means that the compound from reactions of this material and copper should have a negative heat of formation, such as a copper oxide. One way to change the surface properties of the nitrided metal diffusion barrier thus is to form an oxy-nitride layer on the surface by oxy-nitriding the nitrided metal diffusion barrier layer surface, and the presence of oxygen in the oxy-nitride layer would promote the adhesion of copper to the diffusion barrier. The oxy-nitride layer comprises the metal, nitrogen, and oxygen, and serves to improve the adhesion of the multilayered diffusion barrier structure to the subsequently deposited layer. As oxygen is incorporated into the nitrided metal diffusion barrier surface, the surface becomes an oxy-nitrided metal, and no longer has the strong diffusion barrier property. This surface thus exhibits strong chemical bonding with the subsequent deposited layer. Furthermore, this thin oxy-nitrided layer is conductive and thus the contact resistance is reduced. The amount of oxygen in the oxy-nitride layer however has a strong affect on the contact resistance. The oxidizing condition will produce an oxide layer, however thin, that raises the contact resistance because of its non conductive property. Care should be taken to avoid the extreme case of oxidizing the nitrided metal diffusion barrier that occurs by introducing an excessive amount of oxygen. One way to avoid over-oxidizing the nitrided metal barrier surface is to introduce a small amount of oxy-nitride contained gas or a precursor that contains oxygen and nitrogen to the barrier surface. The introduction of the oxy-nitride or oxygen-nitrogen combination reduces oxidizing of the surface. Therefore a method to improve the adhesion of the nitrided metal diffusion barrier without introducing a non-conductive oxide layer is to have a multilayer: a nitrided metal diffusion barrier layer to block foreign material diffusion, and a thin oxy-nitrided metal layer to provide the adhesion property. The oxygen content in this oxy-nitrided layer is small such that the nitrided metal layer is not oxidized and results in a non-conductive layer.

In the oxy-nitriding process, the metal comes from the nitrided metal diffusion barrier layer, oxygen comes from the ambient, and nitrogen can be from the nitrided metal diffusion barrier layer and the ambient. There are different ways of incorporating the metal, oxygen, nitrogen to form the oxy-nitride layer. One way is to introduce a small amount of oxygen to a thin surface of the nitrided metal diffusion barrier. To provide a thin oxy-nitrided metal layer such as TiON, TiSiON, TaON, TaSiON, WON, WSiON, the nitrided metal diffusion barrier surface is oxy-nitrided in an oxygen-contained ambient. The oxy-nitrided metal adhesion property improvement is most effective with TiN, a less effective diffusion barrier, and much less effective with TaN, a more effective diffusion barrier. This method uses the nitrogen from the nitrided diffusion barrier layer. Another way is to introduce oxygen and nitrogen from an ambient. Additional nitrogen thus comes from the ambient source. Another way is to deposit a thin oxy-nitride metal diffusion barrier layer by using an oxygen/nitrogen precursor together with the precursors needed to deposit the nitrided metal diffusion barrier. Not all oxy-nitrided materials however exhibit good adhesion property.

Cleaning the diffusion barrier, a method proposed by Charneski et al., in U.S. Pat. No. 5,909,637 has a very limited success because it does not change the fundamental properties of the diffusion barrier surface. Oxidizing the diffusion barrier, a method proposed by Nguyen et al., in U.S. Pat. No. 5,913,144, is a proper method of improving the adhesion property. However, the improvement in adhesion is offset by the introduction of a non-conductive oxide layer with the use of reactive oxygen species from a predominately oxygen plasma. Nguyen et al.'s method solved the high contact resistance problem related to the non-conductive oxide layer by limiting the thickness of this layer to less than 3 nm and relying on the tunneling phenomenon to provide the conduction path.

An improved method to improve adhesion is to form a multilayer: a nitrided metal diffusion barrier layer and a thin oxy-nitride metal layer. The thin oxy-nitride metal layer comprises the metal, nitrogen, and oxygen, hence the name oxy-nitride metal, the oxygen species being less than the nitrogen species, that works best since it is much more conductive than an oxide, and the adhesion property does not differ significantly.

Accordingly, a method to improve the adhesion property of copper to the nitrided metal diffusion barriers such as TiN, TiSiN, TaN, TaSiN, WN, WSiN, by forming a multilayered diffusion barrier structure is provided. The provided multilayered diffusion barrier is deposited on an underlayer, and provides improved adhesion to a subsequently deposited layer. The method comprises the steps of:

a) Depositing a nitrided metal diffusion barrier layer on the underlayer in a diffusion barrier deposition equipment, whereby this diffusion barrier layer serves as a barrier between the underlayer and the subsequently deposited layer;

b) Forming a thin metal nitrogen-rich oxy-nitride layer by oxy-nitriding the diffusion barrier material surface, this oxy-nitride layer comprises the metal, nitrogen, and oxygen, the oxygen species being less than the nitrogen species, whereby this layer serves to improve the adhesion of the multilayered diffusion barrier structure to the subsequently deposited layer.

The two layers: nitrided metal diffusion barrier layer and the oxy-nitrided metal layer are formed in sequence. The method includes the formation of these two layers in two separate locations: two process chambers in the same process equipment, or in two separate process equipment. The formation of the nitrided metal diffusion barrier will occur in the first process chamber (of the two chamber equipment), or in the first process equipment. The substrate will then be moved to the second process chamber (of the two chamber equipment), or to the second process equipment for the oxy-nitriding process. The oxy-nitriding process to form the oxy-nitrided metal layer will require an oxygen-contained ambient. In some aspects of the invention, an elevated temperature is also provided. The elevated temperature ranges from 200° C. to 1200° C., with 300–500° C. being a typical temperature range. The oxy-nitriding time ranges from a few seconds to several minutes, depending on many factors such as the optimization of process flow, the optimization of the desired level of adhesion, the optimization of contact resistance, etc.

In some aspects of the invention, the nitrided metal diffusion barrier is selected from a group consisting of TiN, TiSiN, TaN, TaSiN, WN, WSiN.

The method also provides the thickness of the oxy-nitride layer on the surface of nitrided metal diffusion barrier to be less than 5 nm. The 5 nm thick or less metal oxy-nitride layer offers adequate adhesion, and does not increase much the overall thickness of the multilayered diffusion barrier structure. Some applications, such as the ones in advanced semiconductor processing, require that the overall diffusion barrier thickness to be less than 50 nm, so a thin metal oxy-nitride layer is desirable, provided that adequate adhesion is achieved.

The method also provides various techniques to deposit the nitrided metal diffusion barrier. The evaporation technique can deliver the nitrided metal diffusion barrier by heating the source material. The sputtering technique can deliver the nitrided metal diffusion barrier by sputtering a target in a nitrogen-contained ambient. TiN diffusion barrier can be formed using a Ti target. Or by using a TiN target, the sputtering technique can deliver TiN without the need for the additional nitrogen ambient. The sputtering technique however does not fill the gap very well. The chemical vapor deposition technique can deliver the nitrided metal diffusion barrier by using appropriate precursors. Typical TiN liquid precursors are tetrakisdimethylaminetitanium (TDMAT), tetrakisdiethylaminetitanium (TDEAT), and tetrakismethylethylaminetitanium (TMEAT). These precursors can be combined with a nitrogen source such as ammonia ($NH_3$), or nitrogen. Typical TaN liquid precursors include pentadiethylaminetantalum (PDMAT), that can be used with or without a nitrogen source. Typical WN chemical vapor deposition uses a precursor such as $WF_6$ with nitrogen. The addition of other materials such as silicon can produce ternary nitrided metal diffusion barriers such as TiSiN, TaSiN, or WSiN. To further excite the precursors, additional energies from a plasma source can be added as in the technique of plasma-enhanced chemical vapor deposition.

The method provides various nitrogen-contained ambient. The nitrogen species can be nitrogen gas, $N_2$, $NH_3$, $N_2O$, $NO_2$, air. The nitrogen species can also be diluted in other gases.

The method also provides various oxygen-contained ambient. To provide a thin oxy-nitrided metal layer, an ambient comprising the oxygen species is needed. The oxygen species can be oxygen gas, $N_2O$, $NO_2$ gas, water vapor, alcohol vapor, OH ligand, chemicals containing OH ligand, chemicals releasing OH ligand upon high temperature annealing. The oxygen species can also be diluted in other gases.

The method also provides the reactive oxygen species by plasma source to oxy-nitriding the nitrided metal diffusion barrier layer. The plasma source can be a direct plasma source or a downstream plasma source. In some aspects of the invention, the nitrided metal diffusion barrier is deposited by plasma-enhanced chemical vapor deposition. In this case, the underlayer is exposed to plasma energies of the diffusion barrier precursors. At the end of the deposition, the diffusion barrier precursors are turned off, and an oxygen-contained ambient is introduced. The presence of the oxygen plasma will incorporate some oxygen into the nitrided metal diffusion barrier to form the metal oxy-nitride metal layer. As mentioned earlier, care should be taken to avoid oxidizing the nitrided metal diffusion barrier.

The method also provides an alternate way to oxy-nitriding the nitrided metal diffusion barrier layer. In the case of the high temperature nitrided metal diffusion barrier deposition process, the oxy-nitriding process occurs during the cooling down period of the diffusion barrier formation. The oxy-nitriding process is then independent of time, i.e. self-limiting, and requires no external heating source, i.e. self-annealing process. A preferred method to achieve this process is to move quickly the deposited hot nitrided metal diffusion barrier to an oxygen-contained ambient where the nitrided metal diffusion barrier is annealed in an oxygen-contained ambient by its own thermal energy. The oxygen-contained ambient could be the atmosphere where the oxygen concentration is about 21%. Most nitrided metal diffusion barrier process requires high temperature, thus this method is applicable to most cases. For example, TiN sputters at 300° C., and TiN CVD occurs at 300–450° C.

The current invention also provides a method to form the multilayered diffusion barrier structure in the same location without the need to move the substrate between growth of the layers of the multilayered diffusion barrier structure. Both the nitrided metal diffusion barrier layer and the metal oxynitride metal layers are formed in the same processing chamber. After completion of the nitrided metal diffusion barrier layer, oxygen-contained ambient is introduced and the layer is oxy-nitrided to form the metal oxynitride layer.

The method also provides a further step of depositing copper on the multilayered diffusion barrier structure, whereby the copper is adhered to a material which prevents the diffusion of copper into regions of the IC underlying the diffusion barrier. In another aspect of the invention, the copper is deposited using chemical vapor deposition technique. Other techniques to deposit copper include electrochemical plating.

An integrated circuit is provided having the first underlayer. This first underlayer could be the source, drain or gate region of the active devices. Optimization could provide also a contact scheme such as silicide contact to improve the contact resistance. This first underlayer could also be the first metal region such as copper interconnect or via. On the first underlayer is the multilayered diffusion barrier that comprises a nitrided metal diffusion barrier and a thin metal oxy-nitride layer. On the multilayered diffusion barrier is a second metal layer such as copper interconnect or via. The second metal layer is connected electrically to the first underlayer or the first metal layer through the multilayered diffusion barrier. The second metal layer cannot diffuse to the first underlayer due to the presence of the multilayered diffusion barrier.

The current invention also provide another method to deposit the multilayered diffusion barrier structure. In this aspect of the invention, the metal oxy-nitride layer is formed by deposition. The method comprises the steps of:

a) Depositing a nitrided metal diffusion barrier layer, whereby this nitrided metal diffusion barrier layer serves as a barrier between the underlayer and the subsequently deposited layer;

b) Depositing an metal oxy-nitride metal layer comprising the process of additionally introducing an oxygen-contained precursor to the diffusion barrier deposition equipment, whereby this metal oxy-nitride layer serves to improve the adhesion of the multilayered diffusion barrier structure to the subsequently deposited layer.

The metal oxy-nitride layer in this method is being deposited instead of growth. In the growth process, the oxygen diffuses into the nitrided metal diffusion barrier and the nitrided metal diffusion barrier grows outward and becomes an oxy-nitride. The thickness of this oxy-nitride layer depends on the amount of oxygen, its energy, growth time. In the deposition process, the metal oxy-nitride layer is deposited directly on the substrate. The oxygen is combined with the diffusion barrier precursors, and as a result the metal oxy-nitride layer is formed on the surface of the diffusion barrier layer.

In some aspects of the invention, the formation of the metal oxy-nitride layer further comprises variations in the nitrided metal diffusion barrier process such as diffusion barrier precursor flow, substrate temperature, precursor temperature, plasma power, and chamber pressure. In the deposition of the nitrided metal diffusion barrier layer, the process conditions are optimized to produce the best diffusion barrier properties. These process conditions are not necessarily best suitable for the adhesion purpose. Therefore the metal oxy-nitride layer deposition process conditions will require modifications of the nitrided metal diffusion barrier process conditions to optimize the desired adhesion feature of this layer.

The method also provides a further step of depositing copper on the multilayered diffusion barrier structure, whereby the copper is adhered to a is material which prevents the diffusion of copper into regions of the IC underlying the diffusion barrier. In another aspect of the invention, the copper is deposited using chemical vapor deposition technique. Other techniques to deposit copper include electrochemical plating.

DETAIL DESCRIPTION OF THE PREFERRED EMBODIMENT

Figure 1:
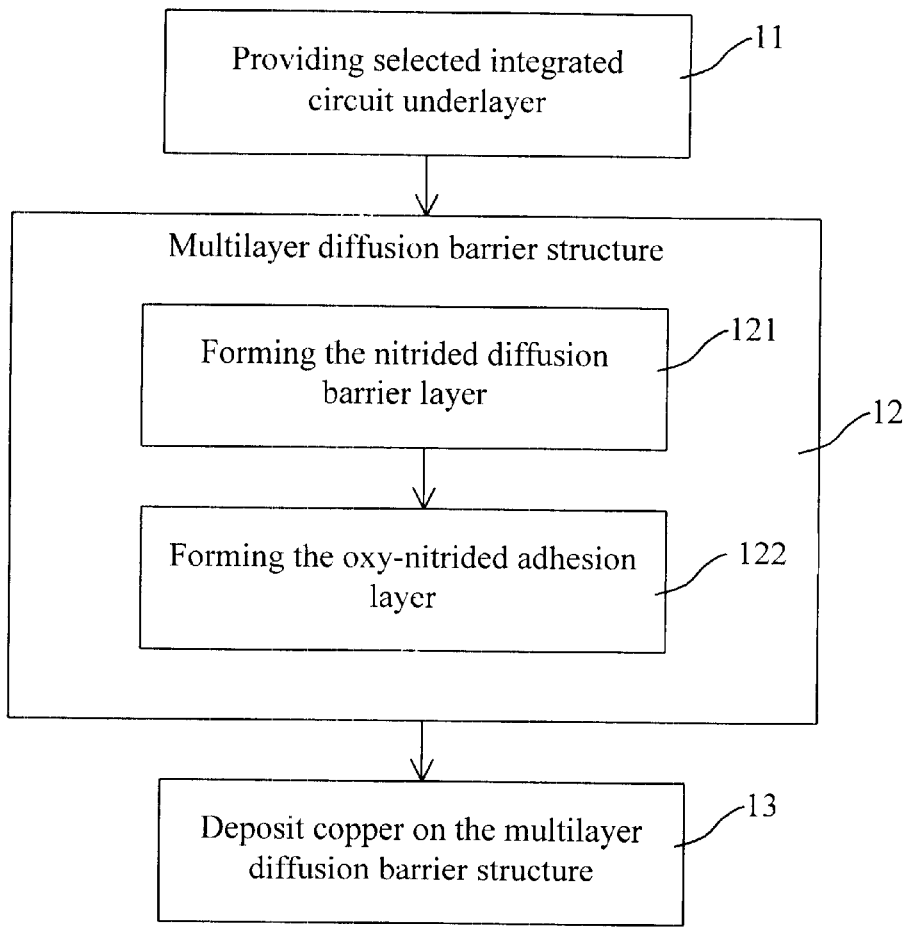
FIG. 1 is a flowchart showing steps in the method of using the multilayered diffusion barrier structure in an integrated circuit processing.

FIG. 1 is a flowchart showing steps in the method of using the multilayered diffusion barrier structure in an integrated circuit processing. Step 11 provides selected integrated circuit underlayer. Step 12 provides the multilayered diffusion barrier structure. Step 12 composes of 2 steps, step 121 and 122. Step 121 provides the nitrided diffusion barrier layer and step 122 provides the oxy-nitride adhesion layer. Step 13 provides the copper layer with improved adhesion to the nitrided diffusion barrier layer.

Figure 2:
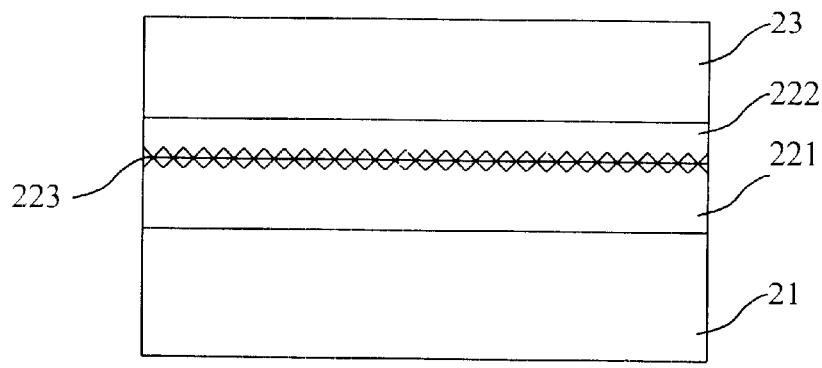
FIG. 2 shows the schematic of the multilayered diffusion barrier structure in an integrated circuit environment.

FIG. 2 shows the schematic of the multilayered diffusion barrier structure in an integrated circuit environment resulted from the flowchart in FIG. 1. Layer 21 is the integrated circuit underlayer. Layer 221 is the nitrided diffusion barrier layer and layer 222 is the oxy-nitride adhesion layer. Together layer 221 and layer 222 form the multilayered diffusion barrier. The interface 223 between the nitrided diffusion barrier layer 221 and the oxy-nitride adhesion layer 222 is not very distinct. It could extend to several nanometers. Layer 23 is the copper layer. The diffusion barrier layer 221 serves to prevent diffusion of copper into the underlayer 21. The oxy-nitride adhesion layer 222 serves to provide the adhesion between the diffusion barrier layer 221 and the copper layer 23.

The underlayer 21 could be the active region of the silicon devices. Since copper introduces a midgap state in the silicon semiconductor, the presence of copper in silicon greatly reduces the resistance of the silicon devices to electrical noise. Therefore to incorporate copper into integrated circuit processing, a diffusion barrier layer 221 is needed to prevent copper from migrating to the underlayer 21. The low contact resistance between the underlayer 21 and the copper layer 23 is a requirement to achieve fast circuit responses. Therefore the underlayer 21 and the diffusion barrier 221 often has a silicide layer to reduce the contact resistance between these 2 layers. The oxy-nitride adhesion layer 222 then needs to have low resistance to be able to offer fast circuit responses. Oxidizing the diffusion barrier, even at a very small thickness, significantly increases the resistance of the adhesion layer since the oxide is a non-conductive material. Oxy-nitriding, on the other hand, can be very conductive. The conductivity of metal oxy-nitrides depends on the amount of oxygen in the layer. Increasing the oxygen content in the metal oxy-nitride will increase its resistance, and a maximum amount of oxygen will turn the nitrided metal into an oxide.

What is claimed is:

1. A method to form a multilayered diffusion barrier structure on an underlayer for improving adhesion to a subsequently deposited layer, the method comprises the steps of:

a) depositing a nitrided metal diffusion barrier layer on the underlayer in a diffusion barrier deposition equipment, whereby this diffusion barrier layer serves as a barrier between the underlayer and the subsequently deposited layer;

b) forming a thin metal nitrogen-rich oxy-nitride layer by oxy-nitriding the diffusion barrier material surface, this oxy-nitride layer comprises the metal species, nitrogen species, and oxygen species, the oxygen species being less than the nitrogen species, whereby this layer serves to improve the adhesion of the multilayered diffusion barrier structure to the subsequently deposited layer.

2. A method as in claim 1 in which the nitrided metal diffusion barrier layer is selected from a group consisting of TiN, TiSiN, TaN, TaSiN, WN, WSiN.

3. A method as in claim 1 in which the oxy-nitride layer is formed by exposing the nitrided metal diffusion barrier surface to an oxygen- and nitrogen-contained ambient, whereby the oxygen species in the oxy-nitride layer is supplied from the oxygen- and nitrogen-contained ambient, and the nitrogen species in the oxy-nitride layer is supplied partly from the oxygen- and nitrogen-contained ambient and partly from the nitrided metal diffusion barrier.

4. A method as in claim 3 in which the exposure of the nitrided metal diffusion barrier surface to an oxygen- and nitrogen-contained ambient occurs in an elevated first temperature environment.

5. A method as in claim 3 in which the oxygen and nitrogen in the oxygen- and nitrogen-contained ambient is exposed to a plasma source.

6. A method as in claim 3 in which the oxygen in the oxygen- and nitrogencontained ambient is selected from a group consisting of $O_2$, $N_2O$, $NO_2$, air, water vapor, alcohol vapor, OH ligand, chemicals containing OH ligand, chemicals releasing OH ligand upon annealing.

7. A method as in claim 1 in which the oxy-nitride layer is formed by exposing the nitrided metal diffusion barrier surface to an oxygen-contained ambient, whereby the oxygen species in the oxy-nitride layer is supplied from the oxygen-contained ambient, and the nitrogen species in the oxynitride layer is supplied solely from the nitrided metal diffusion barrier.

8. A method as in claim 7 in which the exposure of the nitrided metal diffusion barrier surface to an oxygen-contained ambient occurs in an elevated first temperature environment.

9. A method as in claim 7 in which the oxygen in the oxygen-contained ambient is exposed to a plasma source.

10. A method as in claim 7 in which the oxygen in the oxygen-contained ambient is selected from a group consisting of $O_2$, $N_2O$, $NO_2$, air, water vapor, alcohol vapor, OH ligand, chemicals containing OH ligand, chemicals releasing OH ligand upon annealing.

11. A method as in claim 1 in which the diffusion barrier deposition process is at an elevated second temperature and the oxy-nitriding process is a self-limiting, self-annealing process, forming by exposing the diffusion barrier to an oxygen-contained ambient, whereby the formation of the thin oxy-nitride layer on top of the diffusion barrier occurs during the cooling down period of the diffusion barrier layer.

12. A method as in claim 1 in which the thickness of the diffusion barrier in the multilayered diffusion barrier structure after the formation of the metal nitrogen-rich oxy-nitride layer is very thin, whereby the multilayered diffusion barrier serves only as an adhesion layer between the subsequently deposited layer to the underlayer.

13. A method as in claim 1 comprises a further step, after step b):

c) depositing the subsequently deposited layer, in which the subsequently deposited layer is a copper layer, in a copper deposition equipment.

14. A method to deposit a multilayered diffusion barrier structure on an underlayer for improving adhesion to a subsequently deposited layer, the method comprises the steps of:

a) depositing a nitrided metal diffusion barrier layer on the underlayer in a diffusion barrier deposition equipment, whereby this diffusion barrier layer serves as a barrier between the underlayer and the subsequently deposited layer;

b) depositing a thin metal nitrogen-rich oxy-nitride layer, this oxy-nitride layer comprises the metal species, nitrogen species, and oxygen species, the oxygen species being less than the nitrogen species, whereby this layer serves to improve the adhesion of the multilayered diffusion barrier structure to the subsequently deposited layer.

15. A method as in claim 14 in which the nitrided metal diffusion barrier layer is selected from a group consisting of TiN, TiSiN, TaN, TaSiN, WN, WSiN.

16. A method as in claim 14 in which the deposition technique is selected from a group consisting of sputtering technique, chemical vapor deposition technique, plasma-enhanced chemical vapor deposition technique, evaporation technique.

17. A method as in claim 14 in which the oxy-nitride layer deposition process comprises an additional oxygen-contained precursor in addition to the precursors used to deposit the metal nitrided diffusion barrier layer.

18. A method as in claim 17 in which the oxygen-contained precursor is a precursor comprising oxygen species, the oxygen species being selected from a group consisting Of $O_2$, $N_2O$, $NO_2$, water vapor, alcohol vapor, OH ligand, chemicals containing OH ligand, chemicals releasing OH ligand upon annealing.

19. A method as in claim 17 in which the oxygen-contained precursor is subjected to a plasma power source.

20. A method as in claim 17 in which the deposition of the oxy-nitrided metal layer further comprises variations in the nitrided metal diffusion barrier process conditions, selecting from a group consisting of precursor flow, temperature, plasma power, pressure.

21. A method as in claim 14 in which the metal species and the nitrogen species of the oxy-nitride layer come from residues of the nitrided metal diffusion barrier layer deposition process and the oxygen species come from an oxygen-contained precursor.

22. A method as in claim 14 in which the thickness of the nitrided metal diffusion barrier in the multilayer diffusion barrier structure after the formation of the oxy-nitrided metal layer is very thin, whereby the multilayer diffusion barrier serves only as an adhesion layer between the subsequently deposited layer to the underlayer.

23. A method as in claim 14 comprises a further step, after step b):

c) depositing the subsequently deposited layer, in which the subsequently deposited layer is a copper layer, in a copper deposition equipment.

24. A method as in claim 23 in which the copper deposition equipment uses chemical vapor deposition method.

* * * * *